United States Patent
Edelman et al.

(10) Patent No.: US 9,507,003 B2
(45) Date of Patent: Nov. 29, 2016

(54) SYSTEM AND METHOD FOR IMAGING OF VASCULAR STRUCTURES USING NON-CONTRAST ENHANCED MAGNETIC RESONANCE IMAGING

(71) Applicants: Robert R. Edelman, Highland Park, IL (US); Ioannis Koktzoglou, Des Plaines, IL (US)

(72) Inventors: Robert R. Edelman, Highland Park, IL (US); Ioannis Koktzoglou, Des Plaines, IL (US)

(73) Assignee: Northshore University Healthsystem, Evanston, IL (US)

( * ) Notice: Subject to any disclaimer, the term of this patent is extended or adjusted under 35 U.S.C. 154(b) by 686 days.

(21) Appl. No.: 14/020,268

(22) Filed: Sep. 6, 2013

(65) Prior Publication Data
US 2014/0077807 A1     Mar. 20, 2014

Related U.S. Application Data

(60) Provisional application No. 61/703,040, filed on Sep. 19, 2012.

(51) Int. Cl.
 *G01R 33/563* (2006.01)
 *G01R 33/48* (2006.01)
 *G01R 33/483* (2006.01)

(52) U.S. Cl.
 CPC ....... *G01R 33/5635* (2013.01); *G01R 33/4824* (2013.01); *G01R 33/4838* (2013.01)

(58) Field of Classification Search
 CPC .......... G01R 33/5635; G01R 33/4824; G01R 33/4838
 See application file for complete search history.

(56) References Cited

U.S. PATENT DOCUMENTS

| | | | |
|---|---|---|---|
| 4,973,906 | A | 11/1990 | Bernstein |
| 5,159,550 | A | 10/1992 | Sakamoto et al. |
| 5,492,124 | A | 2/1996 | Purdy |
| 5,652,514 | A | 7/1997 | Zhang et al. |
| 5,999,839 | A | 12/1999 | Hardy et al. |
| 6,240,310 | B1 | 5/2001 | Bundy et al. |
| 6,320,377 | B1 | 11/2001 | Miyazaki et al. |

(Continued)

FOREIGN PATENT DOCUMENTS

WO    2007124244 A1    11/2007

OTHER PUBLICATIONS

Brittain, et al., Three-Dimensional Flow-Independent Peripheral Angiography, Magnetic Resonance in Medicine, 1997, 38:343-354.

(Continued)

*Primary Examiner* — G. M. Hyder
(74) *Attorney, Agent, or Firm* — Quarles & Brady, LLP (57) ABSTRACT

A system and method is provided for acquiring a medical image of a portion of a vascular structure of a subject using a magnetic resonance imaging (MRI) system. At least one radio frequency (RF) saturation pulse is applied to a selected region of a subject that is free of exogenous contrast agents using the MRI system to saturate spins of all tissues within the selected region. A delay time is selected to allow an inflow of unsaturated vascular spins that are free of influence from exogenous contrast agent into the selected region through vascular structures within the selected region. A sparse dataset is formed from a series of spatially-encoded views from the selected region using an undersampled radial k-space trajectory in which the center of k-space is sampled for each view in the series of spatially-encoded views. An image of the vascular structures within the selected region is reconstructed from the sparse dataset.

9 Claims, 4 Drawing Sheets

(56) References Cited

U.S. PATENT DOCUMENTS

| | | | |
|---|---|---|---|
| 7,412,277 | B1 | 8/2008 | Saranathan et al. |
| 8,332,010 | B2 | 12/2012 | Edelman |
| 2002/0032376 | A1 | 3/2002 | Miyazaki et al. |
| 2002/0188190 | A1 | 12/2002 | Kassai et al. |
| 2003/0117136 | A1 | 6/2003 | Wang et al. |
| 2005/0010104 | A1 | 1/2005 | Fayad et al. |
| 2005/0065430 | A1 | 3/2005 | Wiethoff et al. |
| 2006/0184002 | A1 | 8/2006 | Yarnykh et al. |
| 2007/0159174 | A1 | 7/2007 | Oshio |
| 2007/0265522 | A1 | 11/2007 | Kassai et al. |
| 2008/0081987 | A1 | 4/2008 | Miyazaki |
| 2009/0062640 | A1 | 3/2009 | Miyoshi |
| 2009/0143666 | A1* | 6/2009 | Edelman .............. A61B 5/055 600/410 |
| 2010/0268062 | A1 | 10/2010 | Edelman |
| 2011/0137146 | A1 | 6/2011 | Edelman |
| 2013/0121550 | A1* | 5/2013 | Chang .............. G06T 11/003 382/130 |
| 2013/0257429 | A1 | 10/2013 | Edelman |
| 2014/0018666 | A1 | 1/2014 | Koktzoglou et al. |
| 2014/0077807 | A1 | 3/2014 | Edelman et al. |
| 2014/0200435 | A1 | 7/2014 | Edelman et al. |

OTHER PUBLICATIONS

Cukur, et al., Signal Compensation and Compressed Sensing for Magnetization-Prepared MR Angiography, IEEE Transactions on Medical Imaging, 2011, 30(5):1017-1027.

Edelman, et al., Fast Time-of-Flight MR Angiography with Improved Background Suppression, Radiology, 1991, 179:867-870.

Edelman, et al., Unenhanced Flow-Independent MR Venography by Using Signal Targeting Alternative Radiofrequency and Flow-Independent Relaxation Enhancement, Radiology, 2009, 250:236-245.

Edelman, et al., Quiescent-Interval Single-Shot Unenhanced Magnetic Resonance Angiography of Peripheral Vascular Disease: Technical Considerations and Clinical Feasibility, Magnetic Resonance in Medicine, 2010, 63 (4):951-958.

Fan, et al., 3D Noncontrast MR Angiography of the Distal Lower Extremities Using Flow-Sensitive Dephasing (FSD)-Prepared Balanced SSFP, Magnetic Resonance in Medicine, 2009, 62:1523-1532.

Fenchel, et al., Multislice First-Pass Myocardial Perfusion Imaging: Comparison of Saturation Recovery (SR)-TrueFISP-Two-Dimensional (2D) and SR-TurboFLASH-2D Pulse Sequences, Journal of Magnetic Resonance Imaging, 2004, 19:555-563.

Francois, et al., Renal Arteries: Isotropic, High-Spatial-Resolution, Unenhanced MR Angiography with Three-Dimensional Radial Phase Contrast, Radiology, 2011, 258(1):254-260.

Gallix, et al., Flow-Independent Magnetic Resonance Venography of the Calf, Journal of Magnetic Resonance Imaging, 2003, 17:421-426.

Hodnett, et al., Evaluation of Peripheral Arterial Disease with Nonenhanced Quiescent-Interval Single-Shot MR Angiography, Radiology, 2011, 260(1):282-293.

Katoh, et al., Free-Breathing Renal MR Angiography with Steady-State Free-Precession (SSFP) and Slab-Selective Spin Inversion: Initial Results, Kidney International, 2004, 66:1272-1278.

Lim, et al., 3D Nongadolinium-Enhanced ECG-Gated MRA of the Distal Lower Extremities: Preliminary Clinical Experience, Journal of Magnetic Resonance Imaging, 2008, 28:181-189.

Lustig, et al., Sparse MRI: The Application of Compressed Sensing for Rapid MR Imaging, Magnetic Resonance in Medicine, 2007,58:1182-1195.

Miyazaki, et al., A Novel MR Angiography Technique: SPEED Acquisition Using Half-Fourier RARE, Journal of Magnetic Resonance Imaging, 1998, 8:505-507.

Miyazaki, et al., Peripheral MR Angiography: Separation of Arteries from Veins with Flow-Spoiled Gradient Pulses in Electrocardiography-Triggered Three-Dimensional Half-Fourier Fast Spin-Echo Imaging, Radiology, 2003, 227:890-896.

Miyazaki, et al., Nonenhanced MR Angiography, Radiology, 2008, 248(1):20-43.

Nakamura, et al., Fresh Blood Imaging (FBI) of Peripheral Arteries: Comparison with 16-Detector Row CT Angiography, Proc. Intl. Soc. Mag. Reson. Med., 2006, 14:1929.

Owen, et al., Magnetic Resonance Imaging of Angiographically Occult Runoff Vessels in Peripheral Arterial Occlusive Disease, New England Journal of Medicine, 1992, 326(24):1577-1581.

Scheffler, et al., Reduced Circular Field-Of-View Imaging, Magnetic Resonance in Medicine, 1998, 40:474-480.

Schreiber, et al., Dynamic Contrast-Enhanced Myocardial Perfusion Imaging Using Saturation-Prepared TrueFISP, Journal of Magnetic Resonance Imaging, 2002, 16:641-652.

Wheaton, et al., Non-Contrast Enhanced MR Angiography: Physical Principles, Journal of Magnetic Resonance Imaging, 2012, 36:286-304.

Wright, et al., Flow-Independent Magnetic Resonance Projection Angiography, Magnetic Resonance in Medicine, 1991, 17:126-140.

Xu, et al., A Novel Non-Contrast MR Angiography Technique Using Triggered Non-Selective Refocused SPACE for Improved Spatial Resolution and Speed, Proc. Intl. Soc. Mag. Reson. Med., 2008, 16:730.

Yamada, et al., Visualization of Cerebrospinal Fluid Movement with Spin Labeling at MR Imaging: Preliminary Results in Normal and Pathophysiologic Conditions, Radiology, 2008; 249:644-652.

Yamashita, et al., Selective Visualization of Renal Artery Using SSFP with Time-Spatial Labeling Inversion Pulse: Non-Contrast Enhanced MRA for Patients with Renal Failure, Proc. Intl. Soc. Mag. Reson. Med., 2005, 13:1715.

* cited by examiner

SYSTEM AND METHOD FOR IMAGING OF VASCULAR STRUCTURES USING NON-CONTRAST ENHANCED MAGNETIC RESONANCE IMAGING

CROSS-REFERENCE TO RELATED APPLICATIONS

The present application is based on, claims priority to, and incorporates herein by reference in its entirety U.S. Provisional Application Ser. No. 61/703,040, filed Sep. 19, 2012, and entitled, "SYSTEM AND METHOD FOR IMAGING OF VASCULAR STRUCTURES USING NON-CONTRAST ENHANCED MAGNETIC RESONANCE IMAGING."

BACKGROUND OF THE INVENTION

The invention relates to a system and method for performing magnetic resonance imaging and, more particularly, to a system and method for acquiring images using magnetic resonance imaging that provide improved, clinically-valuable, magnetic-resonance images of vascular structures.

When a substance such as human tissue is subjected to a uniform magnetic field (polarizing field $B_0$), the individual magnetic moments of the nuclear spins in the tissue attempt to align with this polarizing field, but precess about it in random order at their characteristic Larmor frequency. Usually the nuclear spins are comprised of hydrogen atoms, but other NMR active nuclei are occasionally used. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$; also referred to as the radiofrequency (RF) field) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation field $B_1$ is terminated. There are a wide variety of measurement sequences in which this nuclear magnetic resonance ("NMR") phenomenon is exploited.

When utilizing these signals to produce images, magnetic field gradients ($G_x$, $G_y$, and $G_z$) are employed. Typically, the region to be imaged experiences a sequence of measurement cycles in which these gradients vary according to the particular localization method being used. The emitted MR signals are detected using a receiver coil. The MRI signals are then digitized and processed to reconstruct the image using one of many well-known reconstruction techniques.

Magnetic resonance angiography (MRA) and, related imaging techniques, such as perfusion imaging, use the NMR phenomenon to produce images of the human vasculature or physiological performance related to the human vasculature. There are three main categories of techniques for achieving the desired contrast for the purpose of MR angiography. The first general category is typically referred to as contrast enhanced (CE) MRA. The second general category is phase contrast (PC) MRA. The third general category is time-of-flight (TOF) or tagging-based MRA.

Contrast-enhanced MRA techniques require venous cannulation and the use of exogenous contrast material. Such agents are costly and expose the patient to added safety risks, namely, nephrogenic systemic fibrosis. Non-enhanced techniques for MRA are helpful for the evaluation of suspected vascular disease in patients with impaired renal function, since they avoid the risk of nephrogenic systemic fibrosis. Examples of newer non-enhanced techniques include Quiescent-Inflow Single-Shot (QISS) MRA, fresh blood imaging, and flow-sensitive dephasing, such as described in co-pending U.S. application Ser. No. 12/574,856, which is incorporated herein by reference in its entirety.

Many of these techniques use an undersampled Cartesian k-space trajectory combined with parallel imaging to reduce echo train length. However, at 1.5 Tesla Cartesian undersampling factors larger than two to four typically produce poor image quality. Specifically, existing methods for non-enhanced MRA include TOF, fresh blood imaging (FBI), quiescent inflow single shot (QISS), and PC imaging techniques. Unfortunately, TOF produces nondiagnostic image quality outside of the head and neck. FBI and QISS both use Cartesian kspace trajectories and, thus, undersampling factors are limited to about four fold.

In certain circumstances, it would be helpful if higher undersampling factors could be used. For instance, a shortened echo train might be needed for patients with fast heart rates. With sufficiently short echo trains, it might even be possible to acquire data from more than one slice within each heartbeat interval, thereby reducing scan duration. Another potential benefit is that shortening the echo train could reduce sensitivity to respiratory motion or blood flow artifacts. Additionally, one could reconstruct subsets of data that demonstrate different tissue contrast properties (e.g. degree of fat suppression or vascular enhancement) compared with images reconstructed from the entirety of the data.

It is well known that radial k-space trajectories permit the use of high undersampling factors without loss of spatial resolution. However, the data must be sparse in order to minimize radial streak artifacts. To achieve this, highly undersampled radial MRA use image subtraction (e.g. post-contrast-pre-contrast, or flow-rephased-flow-dephased) in order to create "sparse data sets." However, the process of image subtraction doubles scan time by because one must collect the two data sets necessary to perform the subtraction. Also, by requiring two separate acquisition, the possibility of misregistration artifact is introduced. Furthermore, the most common way to acquire image sets suitable for subtraction is to acquire and subtract a contrast-enhanced and non-contrast-enhanced data set, which reintroduces the drawback of using contrast agents and the implication of nephrogenic systemic fibrosis.

Therefore, it would be desirable to have a system and method for clinical use that is not limited in the way that the above-described and other available techniques are limited.

SUMMARY OF THE INVENTION

The present invention overcomes the aforementioned drawbacks by providing a system and method for acquiring a medical image of a portion of a vascular structure of a subject using a magnetic resonance imaging (MRI) system. Specifically, a system and method is provided for non-contrast-enhanced MRA imaging with sufficiently short echo trains to acquire images of arterial anatomy without the need for cardiac gating.

In accordance with one aspect of the invention, a magnetic resonance imaging (MRI) system is provided. The system includes a magnet system configured to generate a polarizing magnetic field about at least a portion of a subject arranged in the MRI system and free of exogenous contrast agents. The system also includes a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals therefrom in parallel. The system further includes a computer system programmed to control the magnetic gradient system and the RF system to apply at least one radio frequency (RF) saturation pulse to a selected region of the subject to saturate spins of all tissues within the selected region and observe a delay time selected to allow an inflow of unsaturated vascular spins that are free of influence from exogenous contrast agent into the selected region through vascular structures within the selected region. The computer system is further programmed to control the magnetic gradient system and the RF system to acquire a sparse dataset formed from a series of spatially-encoded views from the selected region using an undersampled radial k-space trajectory in which the center of k-space is sampled for each view in the series of spatially-encoded views and reconstruct an image of the vascular structures within the selected region from the sparse dataset.

In accordance with another aspect of the invention, a method is provided for acquiring a medical image of a portion of a vascular structure of a subject using a magnetic resonance imaging (MRI) system. The method includes applying at least one radio frequency (RF) saturation pulse to a selected region of a subject that is free of exogenous contrast agents using the MRI system to saturate spins of all tissues within the selected region. The method also includes applying a delay time selected to allow an inflow of unsaturated vascular spins that are free of influence from exogenous contrast agent into the selected region through vascular structures within the selected region. The method further includes acquiring a sparse dataset formed from a series of spatially-encoded views from the selected region using an undersampled radial k-space trajectory in which the center of k-space is sampled for each view in the series of spatially-encoded views. The method also includes reconstructing an image of the vascular structures within the selected region from the sparse dataset.

The foregoing and other advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
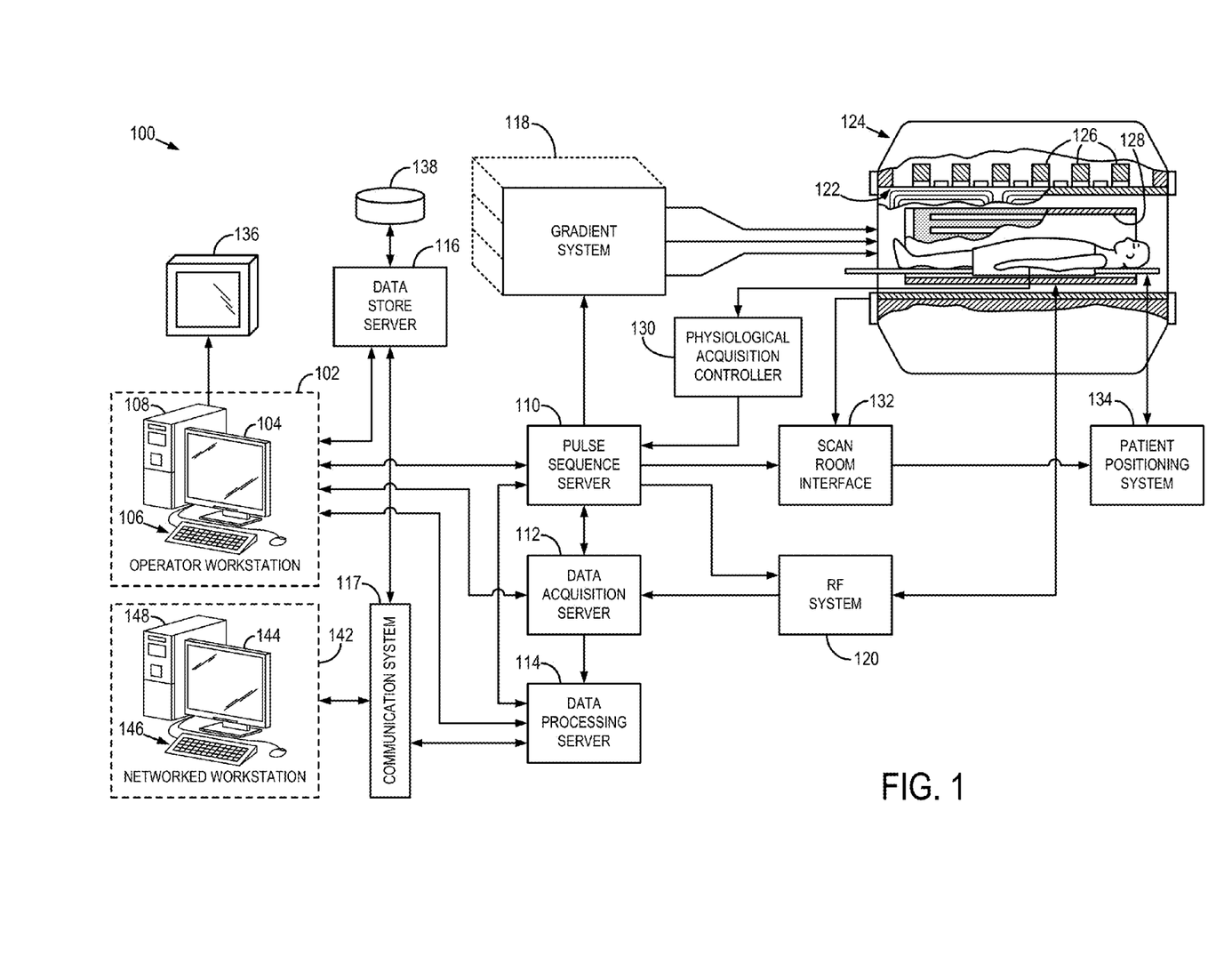
FIG. 1 is a block diagram of an MRI system for use with the present invention.

Referring particularly now to FIG. 1, an example of a magnetic resonance imaging (MRI) system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients and used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the quadrature components of the received magnetic resonance signal. The magnitude of the received magnetic resonance signal may, therefore, be determined at any sampled point by the square root of the sum of the squares of the and components:

$$M=\sqrt{I^2+Q^2} \qquad \text{Eqn. (1)};$$

and the phase of the received magnetic resonance signal may also be determined according to the following relationship:

$$\varphi = \tan^{-1}\left(\frac{Q}{I}\right). \qquad \text{Eqn. (2)}$$

The pulse sequence server 110 also optionally receives patient data from a physiological acquisition controller 130.

By way of example, the physiological acquisition controller 130 may receive signals from a number of different sensors connected to the patient, such as electrocardiograph ("ECG") signals from electrodes, or respiratory signals from respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
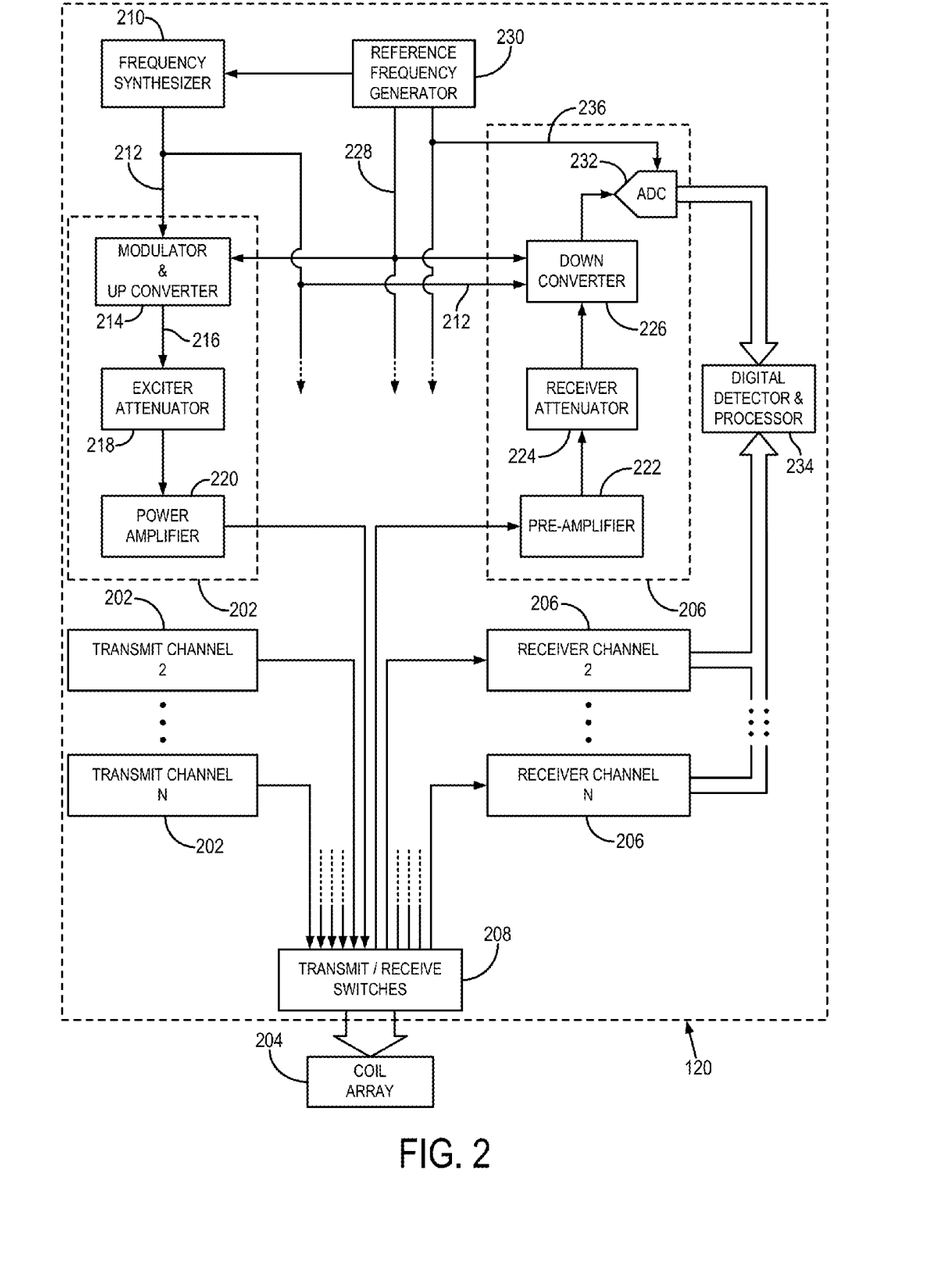
FIG. 2 is a schematic representation of a transceiver system for use with the MRI system of FIG. 1.

As shown in FIG. 1, the radiofrequency ("RF") system 120 may be connected to the whole body RF coil 128, or, as shown in FIG. 2, a transmission section of the RF system 120 may connect to one or more transmit channels 202 of an RF coil array 204 and a receiver section of the RF system 120 may connect to one or more receiver channels 206 of the RF coil array 204. The transmit channels 202 and the receiver channels 206 are connected to the RF coil array 204 by way of one or more transmit/receive ("T/R") switches 208.

Though illustrated as having multiple transmit channels 202 and multiple receiver channels 206 connected to multiple transmit/receive switches 208, the present invention is not limited to traditional or parallel imaging systems. However, as will be further made apparent below, the dual-contrast imaging technique to be described may particularly benefit from parallel imaging acceleration in the phase-encoding direction.

Also, the receiver channel 206 may also be an assembly of coils separate from the transmit coil array. In such a configuration, the T/R switches 208 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 2, the RF system 120 includes one or more transmit channels 202 that produce a prescribed RF electromagnetic field. The base, or carrier, frequency of this RF field is produced under control of a frequency synthesizer 210 that receives a set of digital signals from the pulse sequence server 110. These digital signals indicate the frequency, amplitude, and phase of the RF carrier signal produced at an output 212. The RF carrier is applied to a modulator and, if necessary, an up converter 214 where its amplitude and phase is modulated in response to a signal, R(t), also received from the pulse sequence server 110. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 216 is attenuated by an attenuator circuit 218 that receives a digital command from the pulse sequence server 110. The phase of the RF pulse may also be altered using phase shifters (not shown). The modulated RF pulses are then applied to a power amplifier 220 that drives one element of the RF coil array 204, or several such elements that are electrically coupled. Multiple transmit channels then drive other elements of the multichannel transmit coil array.

The MR signal produced by the subject is picked up by the RF coil array 202 and applied to the inputs of the set of receiver channels 206. A preamplifier 222 in each receiver channel 206 amplifies the signal, which is then attenuated, if necessary, by a receiver attenuator 224 by an amount determined by a digital attenuation signal received from the pulse sequence server 110. The received signal is at or around the Larmor frequency, and this high frequency signal may be down converted in a two step process by a down converter 226. In an example of such a process, the down converter 226 first mixes the MR signal with the carrier signal on line 212 and then mixes the resulting difference signal with a reference signal on line 228 that is produced by a reference frequency generator 230. The MR signal is applied to the input of an analog-to-digital ("A/D") converter 232 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal may then be applied to a digital detector and signal processor 234 that produces in-phase (I) and quadrature (Q) values corresponding to the received signal. The resulting stream of digitized I and Q values of the received signal are output to the data acquisition server 112. In addition to generating the reference signal on line 228, the reference frequency generator 230 also generates a sampling signal on line 236 that is applied to the A/D converter 232.

Figure 3:
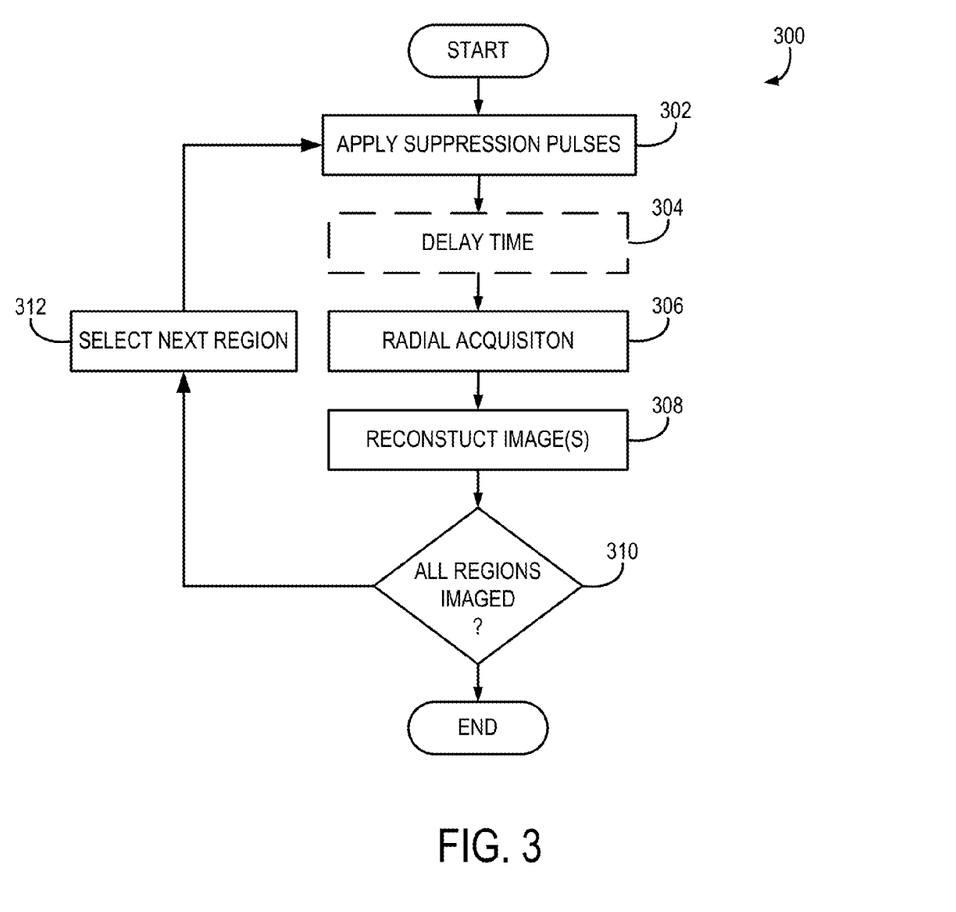
FIG. 3 is a flow chart of the steps performed in accordance with one exemplary implementation of the present invention.

Referring to FIG. 3, a flow chart setting forth the steps of a method 300 for operating an MRI system, such as described above with respect to FIGS. 1 and 2, is provided. The process begins at process block 302 by applying one or more radiofrequency (RF) pulses to suppress the signal intensity of all tissues within a region. As described, the subject may be free of exogenous contrast agents or materials. Thereafter, at process block 304, a time period or "delay time" is provided to allow the inflow of fresh vascular spins into the region. The delay time is specifically selected to create a "sparse" image in which the only bright structures are blood vessels and, as noted, this brightness is caused by the difference in the saturated and unsaturated spins and need not utilize exogenous contrast agents or materials. At process block 306, a series of spatially-encoded views are acquired from a region using an undersampled radial k-space trajectory in which the center of k-space is sampled for each view. Specifically, data acquisition is timed such that the k-space data is sparse by nature of the flow dynamics and spin saturation and, thus, the present invention avoids the need to perform subtractions to create a sparse dataset.

Images are reconstructed from one or more subsets of k-space data at process bock 308. Image reconstruction may include traditional reconstruction methods or other reconstruction methods, such as implementing techniques form compressed sensing. Notably, there are some reconstruction techniques that are particularly useful with sparse data sets, such as many utilizing techniques associated with compressed sensing and the like.

If, at decision block 310, all desired regions have not yet been imaged, another desired region is selected at process block 312 and the process is repeated. Specifically, regions are selected and the process iterated to yield images suitable to create limited or full thickness angiograms of the scanned regions.

Figure 4:
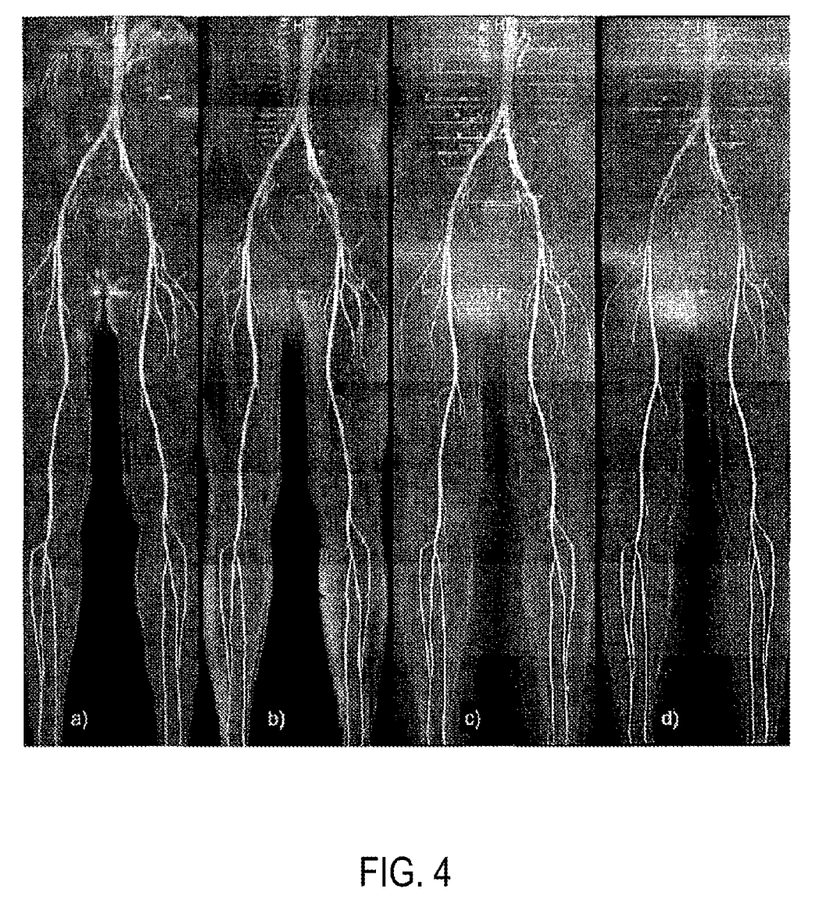
FIG. 4 is a collection of exemplary images acquired using the present invention.

Referring to FIG. 4, a series of images are illustrated. Specifically, the images show maximum intensity projections of (a) single-slice Cartesian QISS using 92 lines, corresponding to an undersampling factor of 4; (b) radial QISS using 92 views, corresponding to an undersampling factor of 5.8; (c) radial QISS using 46 views (2-slice), corresponding to an undersampling factor of 11.5; (d) radial QISS using 32 views (3-slices), corresponding to an undersampling factor of 18.8. The heart rate was approximately 80 bpm (average heartbeat duration of 750 ms). Total scan time was 4.8 minutes for single-slice Cartesian and radial QISS, 2.4 minutes for 2-slice radial QISS, and 1.6 minutes for 3-slice radial QISS. Image quality was satisfactory for all acquisitions.

The present innovation does not require the use of exogenous contrast agents. With respect to existing methods for non-enhanced MRA, the present invention allows for much shorter echo trains. Furthermore, the present invention facilitates the acquisition of data for more than one slice in each heartbeat, thereby shortening scan time. In addition, the present invention facilitates the reconstruction of subsets of data during periods of the cardiac cycle when flow artifacts are minimized. Further still, the present invention improves fat suppression by reconstructing small subsets of data from the period immediately following the application of fat saturation RF pulses. Also, the present invention reduces motion artifacts by using very short echo trains.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MM) system, comprising:
   a magnet system configured to generate a polarizing magnetic field about at least a portion of a subject arranged in the MRI system and free of exogenous contrast agents;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals therefrom in parallel; and
   a computer system programmed to:
      control the magnetic gradient system and the RF system to apply at least one radio frequency (RF) saturation pulse to a selected region of the subject to saturate spins of all tissues within the selected region;
      observe a delay time selected to allow an inflow of unsaturated vascular spins that are free of influence from exogenous contrast agent into the selected region through vascular structures within the selected region;
      control the magnetic gradient system and the RF system to acquire a sparse dataset formed from a series of spatially-encoded views from the selected region using an undersampled radial k-space trajectory in which the center of k-space is sampled for each view in the series of spatially-encoded views; and reconstruct an image of the vascular structures within the selected region from the sparse dataset, wherein the sparse dataset includes more than one slice acquired in each heartbeat of the subject.

2. The system of claim 1 wherein the computer system is further programmed to reconstructing includes perform a compressed-sensing technique to reconstruct the image of the vascular structures.

3. The system of claim 1 wherein acquiring the delay time is further observed such that the sparse dataset is sparse based on the flow dynamics and spin saturations.

4. The system of claim 1 wherein computer system is further configured to acquire the sparse dataset and reconstruct the image of the vascular structures without performing subtractions to sparsify the sparse dataset.

5. The system of claim 1 wherein the computer system is further configured to acquire the sparse dataset without cardiac gating.

6. A method for acquiring a medical image of a portion of a vascular structure of a subject using a magnetic resonance imaging (MM) system, the method comprising:

applying at least one radio frequency (RF) saturation pulse to a selected region of a subject that is free of exogenous contrast agents using the MM system to saturate spins of all tissues within the selected region;

applying a delay time selected to allow an inflow of unsaturated vascular spins that are free of influence from exogenous contrast agent into the selected region through vascular structures within the selected region;

acquiring a sparse dataset formed from a series of spatially-encoded views from the selected region using an undersampled radial k-space trajectory in which the center of k-space is sampled for each view in the series of spatially-encoded views; and reconstructing an image of the vascular structures within the selected region from the sparse dataset, wherein acquiring the sparse dataset includes acquiring more than one slice in each heartbeat of the subject.

7. The method of claim 6 wherein reconstructing includes performing a compressed-sensing technique as part of an image reconstruction method.

8. The method of claim 6 wherein acquiring the delay time is further such that selected sparse dataset is sparse based on the flow dynamics and spin saturations.

9. The method of claim 6 wherein the steps of acquiring and reconstruction are free from subtractions used to create a sparse dataset.

* * * * *

UNITED STATES PATENT AND TRADEMARK OFFICE
CERTIFICATE OF CORRECTION

PATENT NO. : 9,507,003 B2  
APPLICATION NO. : 14/020268  
DATED : November 29, 2016  
INVENTOR(S) : Edelman et al.

Page 1 of 1

It is certified that error appears in the above-identified patent and that said Letters Patent is hereby corrected as shown below:

In the Claims

Column 9, Line 23, Claim 6 - delete "(MM)" and insert -- (MRI) --

Column 10, Line 1, Claim 6 - delete "MM" and insert -- (MRI) --

Signed and Sealed this  
Twenty-first Day of March, 2017

Michelle K. Lee  
*Director of the United States Patent and Trademark Office*